US007593448B2

(12) United States Patent
Takaki et al.

(10) Patent No.: US 7,593,448 B2
(45) Date of Patent: Sep. 22, 2009

(54) SEMICONDUCTOR LASER MODULE AND OPTICAL TRANSMISSION APPARATUS USING THE SEMICONDUCTOR LASER MODULE

(75) Inventors: Keishi Takaki, Tokyo (JP); Junji Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 402 days.

(21) Appl. No.: 10/837,682

(22) Filed: May 4, 2004

(65) Prior Publication Data

US 2005/0249259 A1    Nov. 10, 2005

(51) Int. Cl.
*H01S 3/08*    (2006.01)
(52) U.S. Cl. ..................... 372/96; 372/43.01
(58) Field of Classification Search .................. 372/96
See application file for complete search history.

(56) References Cited

U.S. PATENT DOCUMENTS 5,331,449 A * 7/1994 Huber et al. .................. 398/76
5,621,747 A * 4/1997 Kitoh et al. ............... 372/45.01

OTHER PUBLICATIONS

Ishino et al. (IDS: Low distortion 1.3 um strained-layer MQW-DFB laser for AM-SCM transmission systems with large channel capacity).*
Ishino et al., Low distortion 1.3 um strained-layer MQW-DFB laser for AM-SCM transmission systems with large channel capacity, Nov. 1997.*
M Ishino, et al., Journal of Lightwave Technology, vol. 15, No. 11, pp. 2172-2178, "Low Distortion 1.3 μm Strained-Layer MQW-DFB Laser for AM-SCM Transmission Systems With Large Channel Capacity", Nov. 1997.

* cited by examiner

*Primary Examiner*—Dung T Nguyen
(74) *Attorney, Agent, or Firm*—Oblon, Spivak, McClelland, Maier & Neustadt, P.C.

(57) ABSTRACT

A semiconductor laser module includes a distributed-feedback laser. When a predetermined transmission loss, a predetermined number of channels, and a predetermined modulation factor per channel are given, a cavity length of the distributed-feedback laser satisfies a condition that a distortion is less than a predetermined distortion level and a carrier-to-noise ratio is more than a predetermined value based on a relation between transmission loss, number of channels, modulation factor per channel, and the cavity length of the distributed-feedback laser.

4 Claims, 8 Drawing Sheets

SEMICONDUCTOR LASER MODULE AND OPTICAL TRANSMISSION APPARATUS USING THE SEMICONDUCTOR LASER MODULE

BACKGROUND OF THE INVENTION

1) Field of the Invention

The present invention relates to a semiconductor laser module that is optically modulated by a subcarrier transmission signal that is used as a community antenna television (CATV) signal or in a mobile communication, and an optical transmission apparatus using the semiconductor laser module.

2) Description of the Related Art

Recently, the CATV system and the mobile communication system have archived high-speed transmission in the broadband multimedia communication by using orthogonal frequency division multiplexing (OFDM), which performs a parallel transmission at low speed using a plurality of subcarriers.

On the other hand, in the optical communication, the wavelength division multiplexing (WDM) system is in a practical use, and an optical transmission apparatus that utilizes the characteristics of light to realize a long-distance transmission or a long-distance relay by combining the WDM system with the CATV system or the mobile communication system. This type of optical transmission apparatus is required to have a low distortion and a high carrier-to-noise (CN) ratio.

The optical transmission apparatus is described in, for example, Masato Ishino and et.al., "Low Distortion 1.3 µm Strained-Layer MQW-DFB Laser for AM-SCM Transmission Systems with Large Channel Capacity", journal of lightwave technology, Vol. 15, No. 11, pp. 2172-2178, Nov. 1997.

The distortion of the optical transmission apparatus can be reduced by lengthening the cavity length of a distributed-feedback (DFB) laser that emits a subcarrier signal light to be modulated by a subcarrier input, and increasing the oscillation output of the DFB laser. However, in this case, the CN ratio degrades in an area where the oscillation output is low, and the low-distortion characteristic and the high CN ratio characteristic cannot be achieved simultaneously.

SUMMARY OF THE INVENTION

The semiconductor laser module according to one aspect of the present invention includes a distributed-feedback laser. When a predetermined transmission loss, a predetermined number of channels, and a predetermined modulation factor per channel are given, a cavity length of the distributed-feedback laser satisfies a condition that a distortion is less than a predetermined distortion level and a carrier-to-noise ratio is more than a predetermined value based on a relation between transmission loss, number of channels, modulation factor per channel, and the cavity length of the distributed-feedback laser.

The optical transmission apparatus according to another aspect of the present invention includes a semiconductor laser module having a distributed-feedback laser. When a predetermined transmission loss, a predetermined number of channels, and a predetermined modulation factor per channel are given, a cavity length of the distributed-feedback laser satisfies a condition that a distortion is less than a predetermined distortion level and a carrier-to-noise ratio is more than a predetermined value based on a relation between transmission loss, number of channels, modulation factor per channel, and the cavity length of the distributed-feedback laser.

The other objects, features, and advantages of the present invention are specifically set forth in or will become apparent from the following detailed description of the invention when read in conjunction with the accompanying drawings.

DETAILED DESCRIPTION

Exemplary embodiments of a semiconductor laser module and an optical transmission apparatus using the semiconductor laser module according to the present invention are explained in detail with reference to the accompanying drawings.

Figure 1:
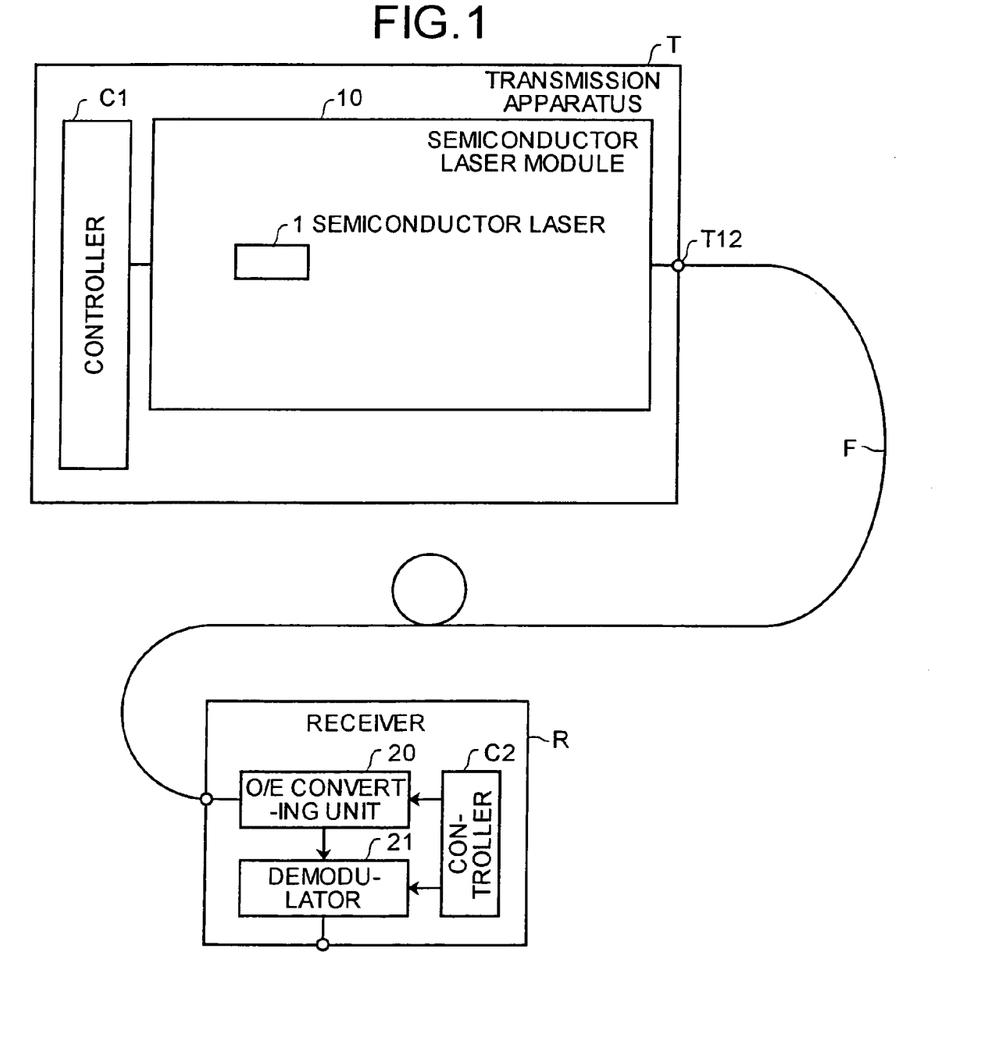
FIG. 1 is a schematic of an optical transmission system that includes an optical transmission apparatus according to an embodiment of the present invention.

FIG. 1 is a schematic of an optical transmission system that includes an optical transmission apparatus according to an embodiment of the present invention. The optical transmission system shown in FIG. 1 includes a transmission apparatus T and a receiver R, and the transmission apparatus T and the receiver R are connected via an optical fiber F, and correspond to the optical transmission apparatus. A plurality of receivers R may be arranged and the receivers R and the transmission apparatus T may be multiple-branching-connected optically.

The transmission apparatus T includes a controller C1 and a semiconductor laser module 10. The semiconductor laser module 10 includes a semiconductor laser 1, which is a DFB laser, and outputs a laser beam with the wavelength corresponding to a subcarrier to the optical fiber F as a carrier. The laser beam is modulated by modulating an injection current of the semiconductor laser 1. The receiver R converts the laser beam into a subcarrier signal, which is an electrical signal, by an optical-to-electrical (O/E) unit, and outputs a serial signal, which is a composite of each subcarrier signal, from a demodulator 21. In the same way as the transmission apparatus T, the subcarrier signal may be output to the outside directly without arranging the demodulator 21.

Figure 2:
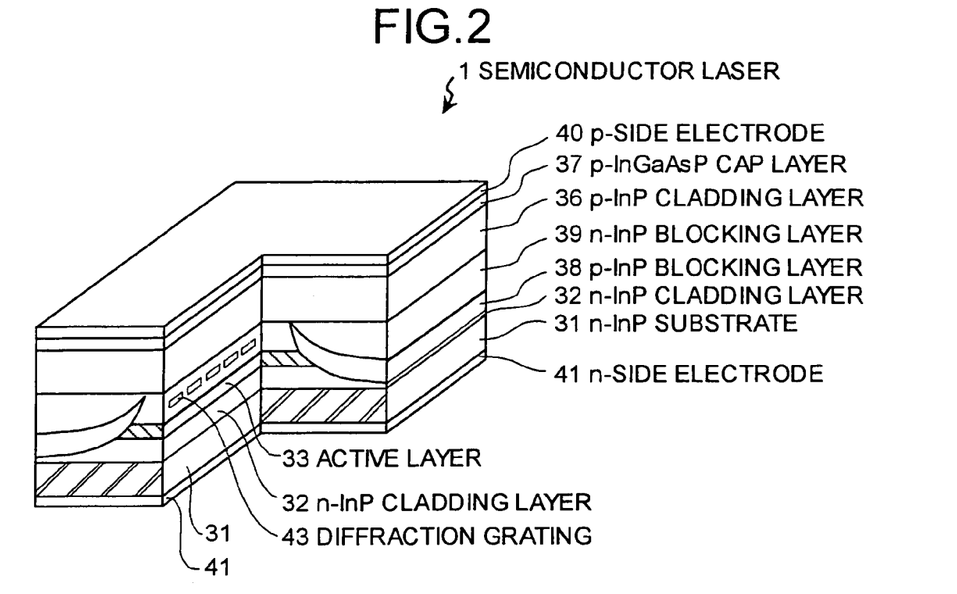
FIG. 2 is a perspective view of a semiconductor laser 1 shown in FIG. 1 with a partial cross-section.
Figure 3:
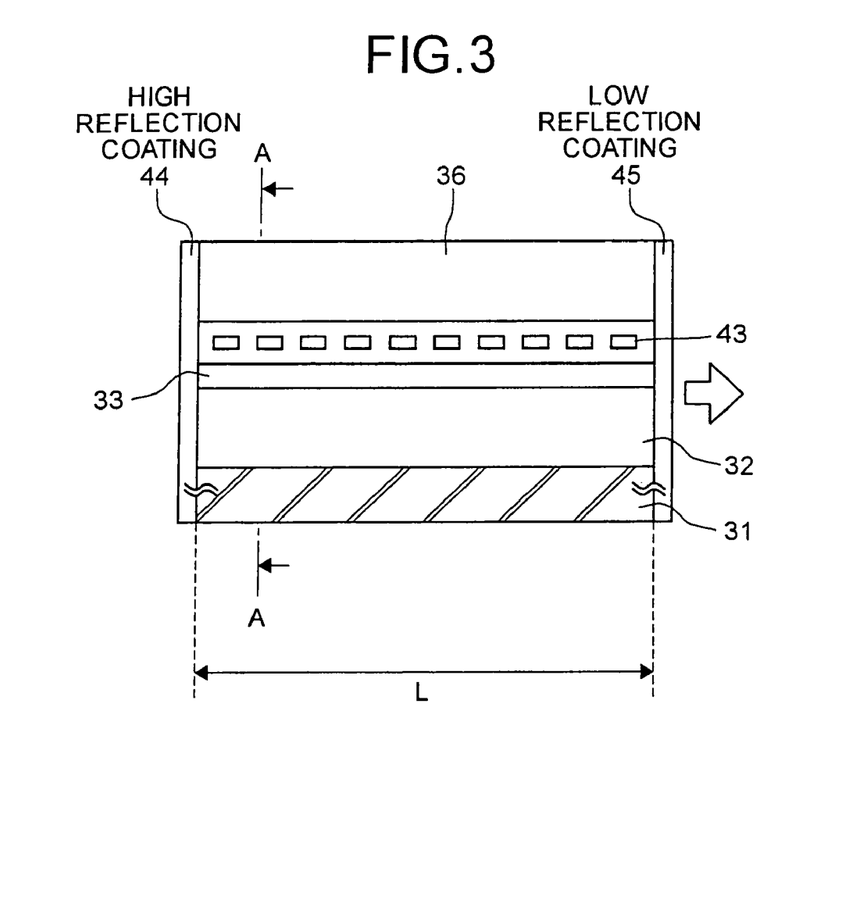
FIG. 3 is a longitudinal cross-section of the semiconductor laser 1.
Figure 4:
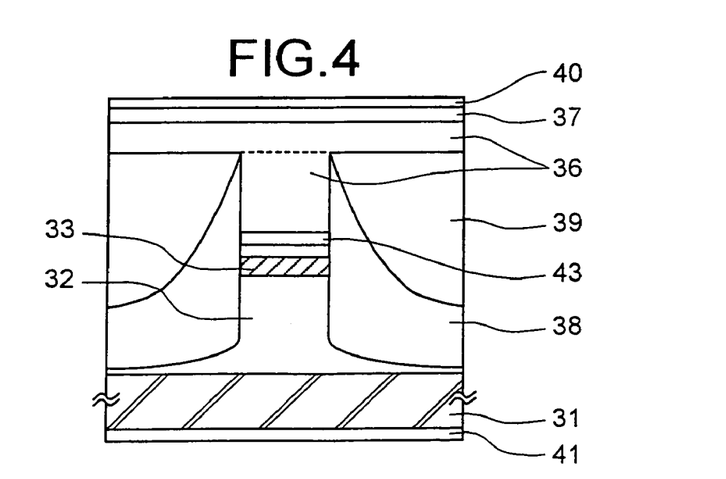
FIG. 4 is a cross section of the semiconductor laser cut along the line A-A.

FIG. 2 is a perspective view of a semiconductor laser 1 shown in FIG. 1 with a partial cross-section; FIG. 3 is a longitudinal cross-section of the semiconductor laser 1; and FIG. 4 is a cross section of the semiconductor laser cut along the line A-A. The semiconductor laser 1 has a structure that an n-InP cladding layer 32 that serves as a buffer layer and a lower cladding layer, an active layer 33 that has six distortion-compensation multiple-quantum-wells, a diffraction grating 43, and a p-InP cladding layer 36, and a p-InGaAsP cap layer 37 are sequentially grown on a (100) surface of an n-InP substrate 1.

A part of the p-InP cladding layer 36, the active layer 33, and the upper part of the n-InP cladding layer 32 are processed so as to form a shape of a mesa stripe, and both sides of the mesa stripe are filled in with a p-InP blocking layer 38 and an n-InP blocking layer 39, which are formed to be a current blocking layers. A p-side electrode 40 is formed on the upper surface of the p-InGaAsP cap layer 37 while an n-side electrode 41 is formed on the back surface of the n-InP substrate 31.

A high reflection coating 44 having a reflectance of at least 80% is formed on a light-reflection facet of the semiconductor laser 1. A low reflection coating 45 having a reflectance of 1% to 5% is formed on the other light-output facet. A light from the active layer 33 of an optical resonator formed by the high reflection coating 44 and the low reflection coating 45 is reflected at the high reflection coating 44 and output via the low reflection coating 45 as a laser beam. The diffraction grating 43 selects the wavelength of the laser beam, and the laser beam is output with the narrow spectrum. A cavity length L indicates a longitudinal length of the active layer 33.

Figure 5:
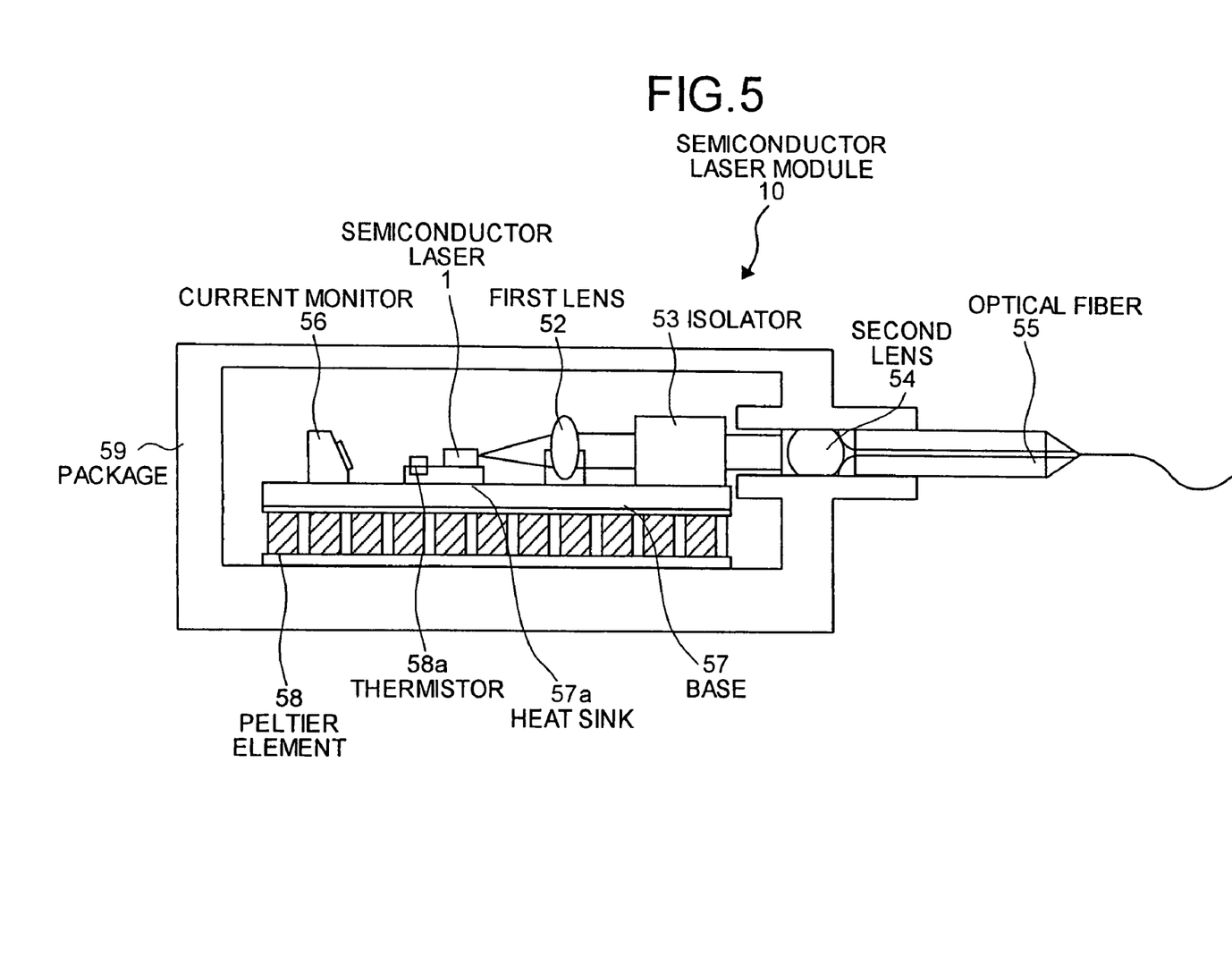
FIG. 5 is a longitudinal cross-section of a semiconductor laser module 10.

FIG. 5 is a longitudinal cross-section of a semiconductor laser module 10 including the semiconductor laser 1. On the inside bottom-surface of a package 59, which is formed of ceramic or the like to be a chassis of the semiconductor laser module 10, a Peltier element 58 is arranged as a temperature controller. A base 57 is arranged on the Peltier element 58, and a heat sink 57a is arranged on the base 57.

The heat sink 57a, a first lens 52, and a current monitor 56 are arranged on the base 57, and on the heat sink 57a, the semiconductor laser 1 and a thermistor 58a are arranged. The laser beam output from the semiconductor laser 1 is guided to an optical fiber 55 via the first lens 52, an isolator 53, and a second lens 54. The second lens 54 is on the optical axis of the laser beam, arranged on the package 59, and optically connected to the optical fiber 55, which is connected externally. The current monitor 56 monitors and detects the light that leaks from the reflection-coating side of the semiconductor laser 1.

In the semiconductor laser module 10, the isolator 53 is arranged between the semiconductor laser 1 and the optical fiber 55 to prevent the light reflected by other optical components from going back and reentering inside the resonator.

Figure 6:
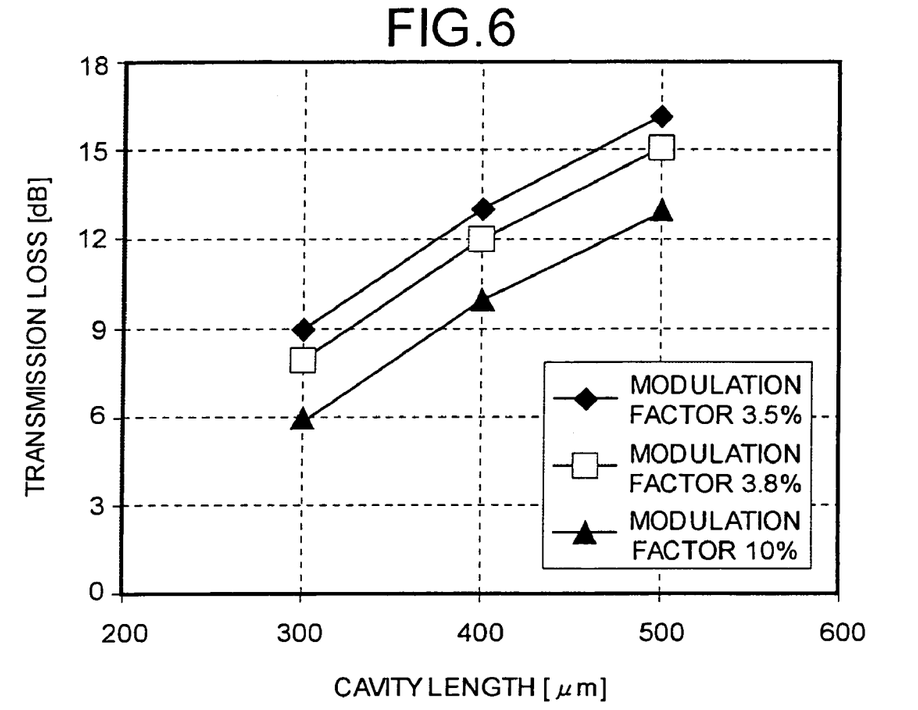
FIG. 6 is a plot of transmission loss versus cavity length when the number of channels and a modulation factor per channel are set.

FIG. 6 is a plot of transmission loss versus cavity length when the number of channels and a modulation factor per channel are set. The plot is indicated by ♦ when the modulation factor is 3.5% (the number of channels=74), the plot is indicated by □ when the modulation factor is 3.8% (the number of channels=79), and the plot is indicated by ▲ when the modulation factor is 10% (the number of channels=2). As shown in FIG. 6, when the transmission loss is determined, the optimal cavity-length is determined corresponding to the transmission loss. The semiconductor laser 1 with the optimal cavity-length can obtain the low-distortion characteristic, at most −60 dB, and the high-CN-ratio characteristic, at least 50 dB, simultaneously while satisfying the transmission loss required.

Especially, when the cavity length L satisfies the following equation, the low-distortion characteristic and the high-CN-ratio characteristic get more optimal. In other words, when the cavity length satisfies $$\text{Loss}=10^{-4}m^{2.5}N^{0.5}L$$

the low-distortion characteristic and the high-CN-ratio characteristic can be obtained. Loss indicates the transmission loss (dB), m indicates the modulation factor per channel, N indicates the number of channels, and L indicates the cavity length (mm).

Figure 7:
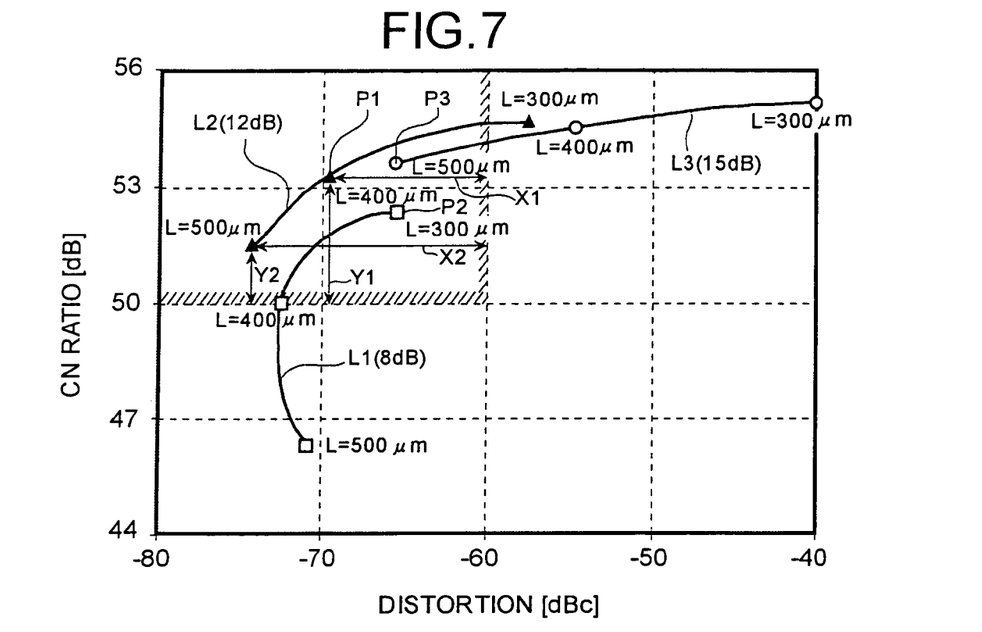
FIG. 7 is a plot of CN ratio versus distortion when a modulation factor is set to 3.8%, a transmission loss is set to 8 dB, 12 dB, an 15 dB, and a cavity length is changed to 300 µm, 400 µm, and 500 µm corresponding to each transmission loss.

The equation is obtainable from the correlation shown in FIG. 6, and the plot value, shown in FIG. 6, is obtainable from the relation shown in FIG. 7. FIG. 7 is a plot of CN ratio versus distortion when a modulation factor is set to 3.8%, a transmission loss is set to 8 dB, 12 dB, and 15 dB, and a cavity length is changed to 300 μm (0.3 mm), 400 μm (0.4 mm), and 500 μm (0.5 mm) corresponding to each transmission loss. At points P1 to P3, the low-distortion characteristic and the high-CN-ratio characteristic are shown while satisfying the distortion of at most −60 dB and the CN ratio of at least 50 dB. The transmission loss is 12 dB and the cavity length is 400 μm at the point P1, the transmission loss is 8 dB and the cavity length is 300 μm at the point P2, and the transmission loss is 15 dB and the cavity length is 500 μm at the point P3. Consequently, the optimal relation between the transmission loss and the cavity length, at the modulation factor of 3.8%, is obtainable as shown in FIG. 6. The optical relation is expressed by the equation described above.

Each of the points P1 to P3 is determined to be an optimal point when a multiplication value of a distortion difference-value and a CN ratio difference-value, or an additional value thereof is the largest. The distortion difference-value corresponds to the distance from the threshold of the distortion, −60 dB, while the CN ratio difference-value corresponds to the distance from the threshold of the CN ratio, 50 dB. For example, at the point P1, X1 is 10 and Y1 is 3, therefore, the multiplication value is X1·Y1=30. At the point with the transmission loss of 12 dB and the cavity length L of 500 μm, X2 is 15 and Y2 is 1.5, therefore, the multiplication value is X2·Y2=22.5. The multiplication value of the point P1 is larger, so that the point P1 is selected as an optimal point.

The optical relation shown in FIG. 6 is obtainable by applying the same to the modulation factor of 3.5% and that of 10%. The optimal relation, shown in FIG. 6, determines the optimal cavity length corresponding to the transmission loss. When, the cavity length L is determined, the allowable transmission-loss is obtainable corresponding to the cavity length L.

Figure 8:
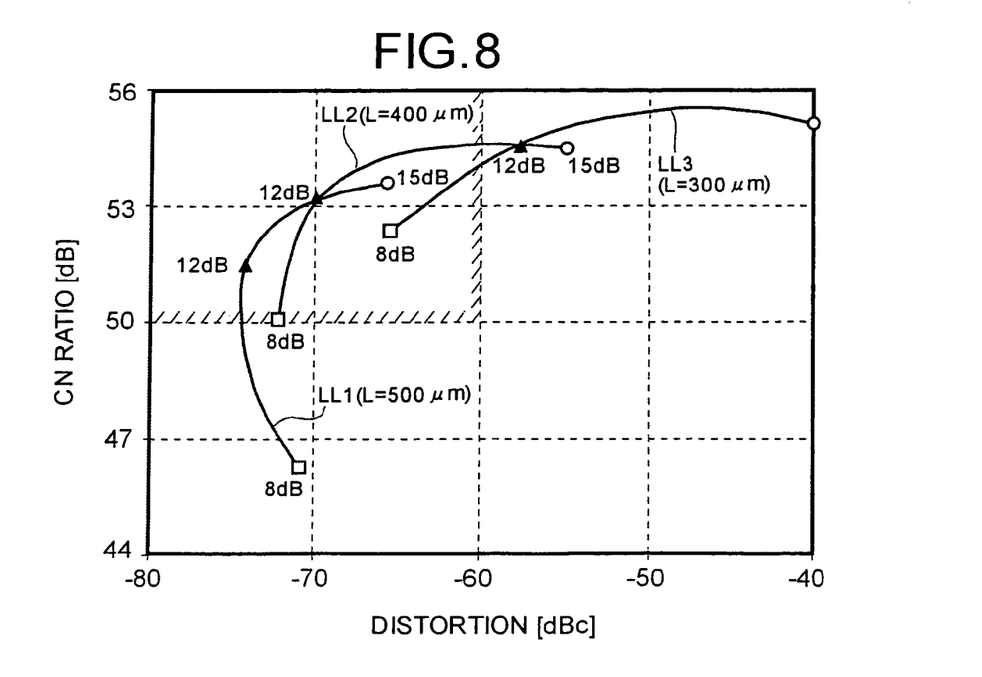
FIG. 8 is a plot of CN ratio versus distortion corresponding to measuring points shown in FIG. 7 when the cavity length is taken as a parameter.

Curves L1 to L3 shown in FIG. 7 are drawn while keeping each transmission loss constant, and curves LL1 to LL3 shown in FIG. 8 are drawn based on the same data while keeping each cavity length L constant. FIG. 7 shows, in case the transmission loss is set, the range of the cavity length L where the distortion is at most −60 dB and the CN ratio is at least 50 dB. On the other hand, FIG. 8 shows, in case the cavity length L is determined, the range of the transmission loss where the distortion is at most −60 dB and the CN ratio is at least 50 dB. Needless to say, the optimal value is obtainable from the equation described above, and the result is shown in FIG. 6.

When the cavity length L is constant, the range of the transmission loss is determined by the cavity length L and represented as a range of $\pm 1/(2L^2)$ from the optimal value. In other words, Loss A, which indicates a range of the transmission loss Loss, is expressed by the following equation $$\text{Loss}A = 10^4 m^{2.5} N^{0.5} L \pm 1/(2L^2).$$

Figure 9A:
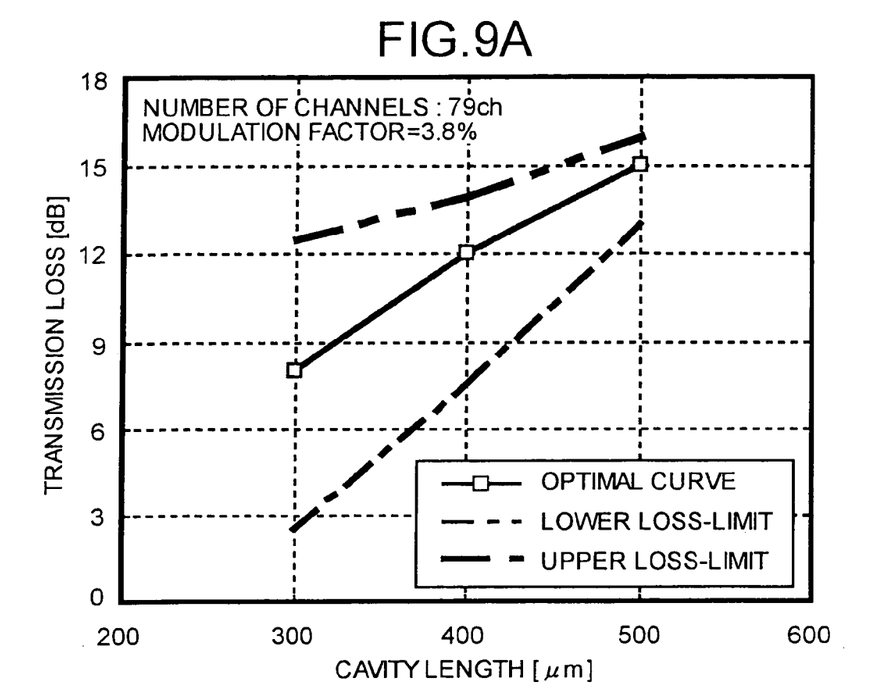
FIG. 9A is a plot of a cavity length dependence of an allowable transmission-loss at modulation factor of 3.8%.
Figure 9B:
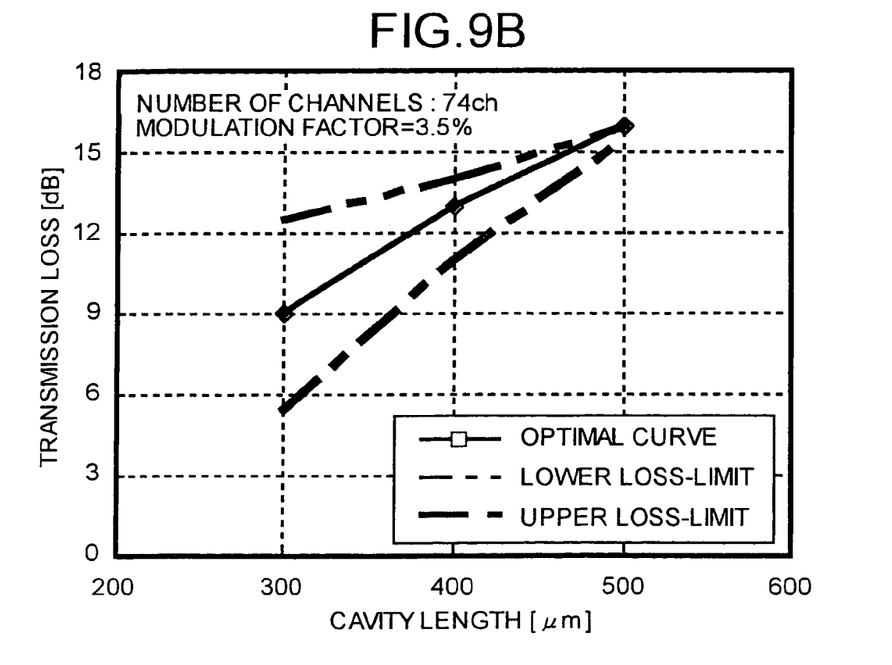
FIG. 9B is a plot of a cavity length dependence of an allowable transmission-loss at modulation factor of 3.5%.
Figure 9C:
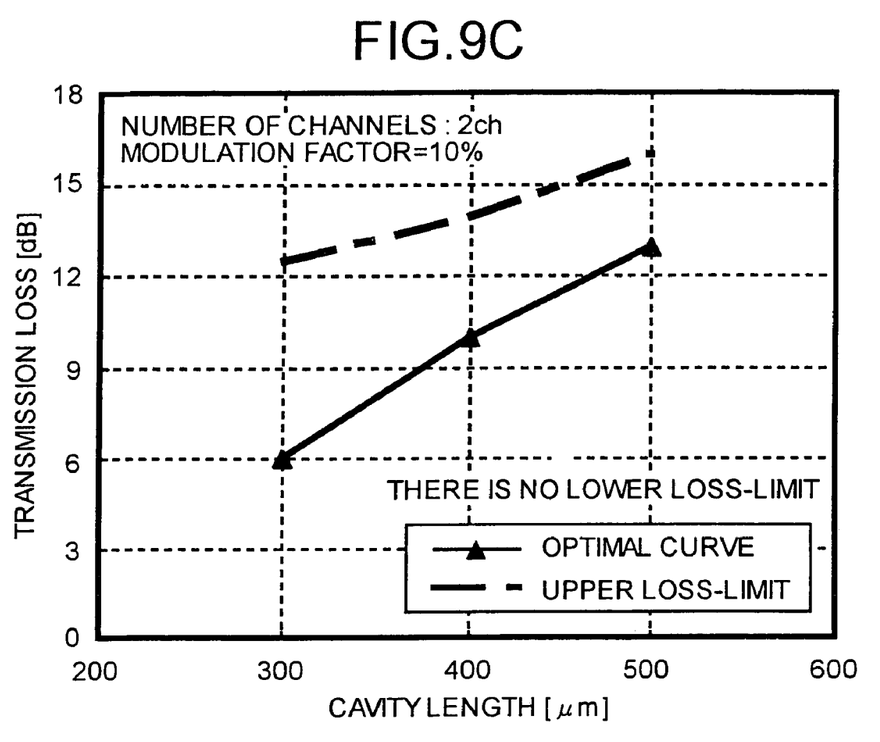
FIG. 9C is a plot of a cavity length dependence of an allowable transmission-loss at modulation factor of 10%.

These are particularly shown in FIGS. 9A to 9C. The modulation factor is 3.8% in FIG. 9A, the modulation factor is 3.5% in FIG. 9B, and the modulation factor is 10% in FIG. 9C. Hereby, the range of the transmission loss in case the cavity length L is determined is obtainable. To the contrary, in case the transmission loss is given, the range of the cavity length L where the distortion is at most −60 dB and the CN ratio is at least 50 dB is obtainable.

In the embodiment, the semiconductor laser 1 is configured to have the cavity length L that satisfies a distortion less than a predetermined distortion (a distortion is at most −60 dB) and a CN ratio more than a predetermined CN ration (a CN ratio is at least 50 dB) when a predetermined transmission loss, a predetermined number of channel, and a predetermined modulation factor per channel are given based on the relation among the transmission loss, the number of channels, the modulation factor per channel, and the cavity length L of the semiconductor laser 1. Consequently, the low-distortion characteristic and the high-CN-ratio characteristic are satisfied simultaneously, and especially, the sufficiently high CN ratio is obtainable even when the output of the semiconductor laser module 10 is low.

What is claimed is:

1. A semiconductor laser module comprising:
a distributed-feedback laser having a cavity with a cavity length;
a current monitor that monitors leaks of a laser beam from the distributed-feedback laser; and
a lens that guides the laser beam to an optical fiber, wherein when a predetermined transmission loss, a predetermined number of channels, and a predetermined modulation factor per channel are given, the distributed-feedback laser is configured to have the cavity length satisfy a condition that a distortion is less than a predetermined distortion level and a carrier-to-noise ratio is more than a predetermined value based on a relation between transmission loss, number of channels, modulation factor per channel, and the cavity length, and
wherein the cavity length of the distributed-feedback laser is configured to have an optimal cavity-length with which a value obtained by multiplying a distortion difference from the predetermined distortion by a carrier-to-noise ratio difference from the predetermined carrier-to-noise ratio is maximum.

2. The semiconductor laser module according to claim 1, wherein an optimal cavity-length is set to a cavity length with which a value obtained by adding a distortion difference from the predetermined distortion and a carrier-to-noise ratio difference from the predetermined carrier-to-noise ratio is maximum.

3. The semiconductor laser module according to claim 1, wherein the cavity length satisfies a following equation $$\text{Loss} = 10^4 m^{2.5} N^{0.5} L$$

where Loss is the transmission loss, m is the modulation factor per channel, N is the number of channels, and L is the cavity length.

4. The semiconductor laser module according to claim 1, wherein the cavity length and the transmission loss determined by an equation $$\text{Loss} = 10^4 m^{2.5} N^{0.5} L$$

where Loss is the transmission loss, m is the modulation factor per channel, N is the number of channels, and L is the cavity length, satisfy that Loss is within a range of $\pm 1/(2L^2)$.

* * * * *